United States Patent [19]
Keller et al.

[11] Patent Number: 5,206,516
[45] Date of Patent: Apr. 27, 1993

[54] LOW ENERGY, STEERED ION BEAM DEPOSITION SYSTEM HAVING HIGH CURRENT AT LOW PRESSURE

[75] Inventors: John H. Keller, Poughkeepsie; Dennis K. Coultas, Hopewell Junction, both of N.Y.

[73] Assignee: International Business Machines Corporation, Armonk, N.Y.

[21] Appl. No.: 692,589

[22] Filed: Apr. 29, 1991

[51] Int. Cl.[5] ............................................. H01J 27/18
[52] U.S. Cl. ............................. 250/492.2; 250/396 R; 250/423 R
[58] Field of Search ........... 250/492.2, 492.21, 396 R, 250/396 ML, 423 R; 315/111.21, 111.41, 111.71; 313/161, 231.31, 231.61

[56] References Cited

U.S. PATENT DOCUMENTS

| | | | |
|---|---|---|---|
| 2,736,809 | 11/1945 | Bacon | 250/423 R |
| 3,304,718 | 2/1967 | Webb | 60/202 |
| 4,151,420 | 4/1979 | Keller et al. | 250/492.2 |
| 4,179,312 | 12/1979 | Keller et al. | 148/1.5 |
| 4,191,888 | 3/1980 | Meadows | 250/396 R |
| 4,233,537 | 11/1980 | Limpaecher | 313/231.3 |
| 4,383,177 | 5/1983 | Keller et al. | 250/423 R |
| 4,409,520 | 11/1983 | Koike et al. | 250/423 R |
| 4,447,761 | 5/1984 | Stinnett | 250/423 R |
| 4,447,773 | 5/1984 | Aston | 313/360.1 |
| 4,585,945 | 4/1986 | Bruel et al. | 250/492.21 |
| 4,596,687 | 6/1986 | Dagenhart | 250/396 R |
| 4,629,930 | 12/1986 | Sakudo et al. | 313/359.1 |
| 4,633,138 | 12/1986 | Tokiguchi et al. | 250/492.2 |
| 4,634,931 | 1/1987 | Taya et al. | 250/492.2 |
| 4,658,143 | 4/1987 | Tokiguchi et al. | 250/423 R |
| 4,687,938 | 8/1987 | Tamura et al. | 250/423 F |

FOREIGN PATENT DOCUMENTS 0135366 10/1962 European Pat. Off. .
907598 10/1962 United Kingdom .

OTHER PUBLICATIONS

"IBM Technical Disclosure Bulletin"; Multipole Containment of Laser Plasma; vol. 22, No. 8A; Keller; Jan. 1980.

*Primary Examiner*—Jack I. Berman
*Assistant Examiner*—Kiet T. Nguyen
*Attorney, Agent, or Firm*—Whitham & Marhoefer

[57] ABSTRACT

An ion beam deposition system in which ions of different masses and from different sources are independently steered into different parts of an analyzer magnet to be converged into a single wide beam which maintains a perpendicular relationship between the beam and the target. The beam is decelerated by a slit type deceleration lens to an energy suitable for deposition. The target is then scanned across the decelerated beam. The beam is maintained at high current and low pressure by confining electrons away from the magnet and/or adding energy to the low pressure atmosphere inside the analyzer magnet to produce a plasma of electrons and charged particles in order to provide adequate neutralizing of the space charge of the beam.

40 Claims, 7 Drawing Sheets

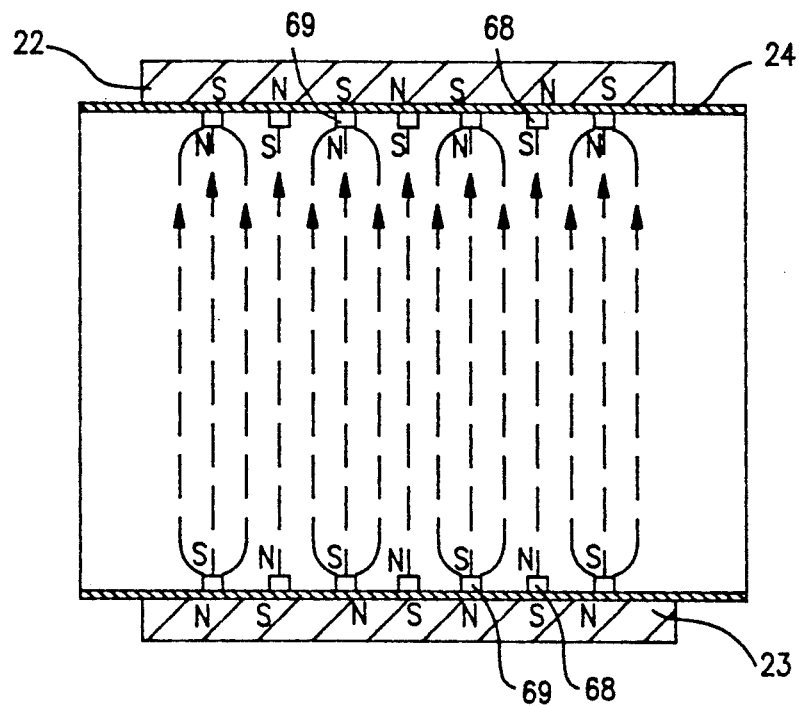
FIG. 6C
FIG. 6D
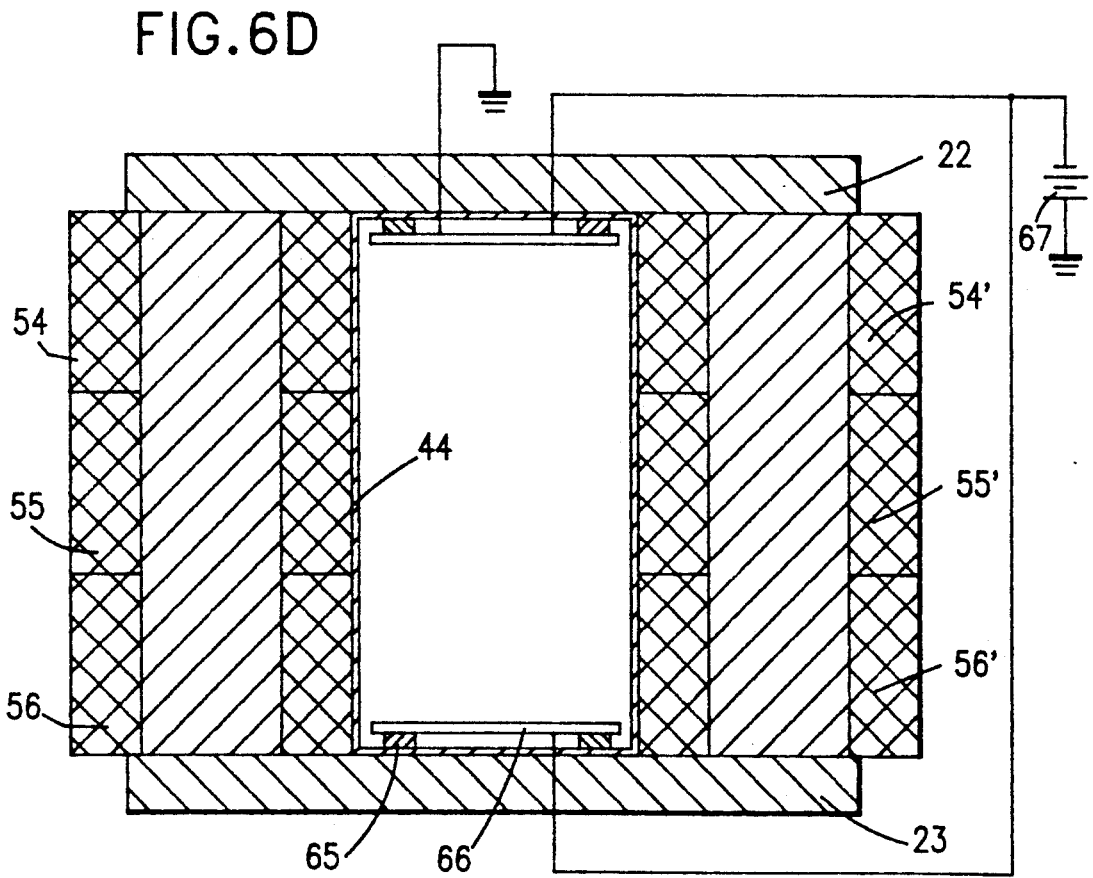

LOW ENERGY, STEERED ION BEAM DEPOSITION SYSTEM HAVING HIGH CURRENT AT LOW PRESSURE

BACKGROUND OF THE INVENTION

1. Field of the Invention

The present invention generally relates to charged particle beam systems and, more particularly, to ion beam systems for depositing material on a semiconductor structure during manufacture of an electronic device, especially in providing epitaxial growth of layers thereof.

2. Description of the Prior Art

The manipulation of beams of charged particles with electrical and magnetic fields has long been known and many devices exploiting this effect have been developed. For example, cathode ray tubes in televisions and oscilloscopes manipulate an electron beam to produce visually perceptible images. Electron beam lithography is also used in the production of highly accurate patterned areas in the manufacture of very large scale integrated circuits (VLSI). It is also known to produce and manipulate beams of other kinds of charged particles, such as in ion beam devices. Such ion beam devices have been used to advantage in certain aspects semiconductor device manufacture, such as in impurity implantation.

Impurity implantation by means of an ion beam is desirable for a number of reasons. The ion beam current and implantation energy can also be very accurately controlled to provide extremely accurate concentrations and distributions of impurities and implantation depths. Such ion implantation processes can also be carried out at low temperatures, allowing the use of low temperature masking materials.

Moreover, the mass of the ion in relation to the charge thereon affects the degree to which it is accelerated both axially and transversely by an electrostatic or magnetic field. Therefore, the beam which reaches a desired area of a chip can be made very pure since ions of differing molecular weight will be deflected to positions away from the beam and implantation of other than desired materials can be avoided. This feature of the ion beam optics of ion beam devices is known as mass analysis and is typically carried out by deflecting the beam through an arc and using an exit aperture of a size which will effectively separate ions of different molecular weight.

Such implantation processes use kinetic effects and are done at high energy to implant the ions within the body of a semiconductor material. More recently, efforts have been made to use an ion beam Process for purposes which require deposition on the surface of a target material, such as for welding. As can be readily understood, a deposition process produced from an ion beam would require the energy of the ion particles to be very much lower than the energies at which implantation is performed. Such reduced energies of the ions cause some difficulties to be encountered in maintaining convergence of the ion beam due to the mutual repulsion of ions bearing a like charge. However, in such an application, the need for high beam current is not necessary because the amount of material is typically small.

The formation of monocrystalline epitaxial layers of a semiconductor material, particularly with conductivity determining impurities, is often necessary in the manufacture of various types of semiconductor devices. This process is often carried out through vapor phase deposition at very high temperatures of approximately 1100°–1200° C. With a few exceptions, such as P-doped and intrinsic silicon, good quality monocrystalline deposition is difficult below about 1000° C. This high temperature requirement for forming a monocrystalline epitaxial layer therefore has the drawback that, particularly if other doped structures have previously been formed, out-gassing effects and/or out-diffusion between regions may occur. In device design, compensation for such effects is often difficult or impossible and can also limit the minimum dimension of conductivity region in the device for a particular manufacturing yield since impurity out-diffusion distances can easily dominate an epitaxial layer which in thinner than about 2 microns or a region of similar lateral dimension. Such out-diffusion due to the high temperature process also results in dopant distribution being less than fully controllable, even when ion implantation is subsequently used to add impurities to the monocrystalline epitaxial layer.

It should also be noted that ion implantation, by itself, does not completely eliminate the need for a high temperature process even though ion implantation can be carried out at low temperatures since the ion implantation process causes damage to the crystal lattice structure and annealing is often necessary to repair the damage before further processing can be carried out.

The use of an ion beam to provide a low temperature process for producing a monocrystalline epitaxial layer has been achieved and is disclosed in detail in Keller et al U.S. Pat. Nos. 4,151,420 and 4,179,312, assigned to the assignee of the present invention and hereby fully incorporated by reference. These techniques are characterized by the use of multi-aperture sources to obtain high ion beam current. Such multi-aperture sources produce a broad beam and it can be readily understood that a significant amount of ion beam current is lost at the mass analysis aperture if good separation of ion masses is to be obtained, even though condensing lenses are used for each of the superimposed beams.

These techniques achieved a relatively high beam current at the target at reasonably low energies of about 500 eV. However, these currents were spread over a relatively large area of the target (e.g. a beam diameter of about 15 cm). Thus, a beam current of about 1 ma/cm$^2$ resulted in a rate of material deposition which limited the throughput of the process. Also, by using such a large beam diameter, the epitaxial growth process was limited to performance of the process over the entire wafer and selective epitaxial growth could not even be limited to the actual chip areas, wasting beam current directed to areas of the wafer between chips.

It has also been found, by the inventors herein, that even lower ion energies are desirable for epitaxial growth during the manufacture of a semiconductor device or other object, such as a mask or calibration grid. For instance, implantation may be performed at a typical energy of approximately 20 Kev, whereas, it has been found, by the inventors herein, that energies of 2 Kev or less are required for epitaxial growth and even lower values are desirable. While the arrangements of the above-incorporated Patents achieved energies of about 0.5 KeV at the target, even faster epitaxial growth can be achieved at energies of 50–300 eV. It has also been found that, for several reasons discussed in more detail below, energies of about 5 KeV are desirable for good performance of mass analysis where epitaxial growth consists of a material which may contain a plurality of elements (e.g. silicon and an impurity element such as boron and arsenic, depending on the conductivity type desired) and which must be deposited simultaneously at coincident locations to assure homogeneity in the epitaxial growth. Such homogeneity also requires that the ions of the different materials reach the target at the same impingement angle, preferably perpendicular to the target, in order to avoid a differential distribution of the elements in the direction of epitaxial growth, particularly if the beam is to be scanned over the region where epitaxial growth is desired. It is also necessary to maintain good beam convergence to assure homogeneity of the epitaxial growth.

Although the arrangements of the above-incorporated patents utilize deceleration lenses, such a differential between mass analysis energies and deposition energies is difficult to achieve consistent with high beam current at the target. Other conflicting requirements also exist in processes for achieving epitaxial crystal growth with ion beam devices. Specifically, it is desirable to perform the process at high vacuum to minimize the possibility of contamination of the deposition and to maintain beam current which would otherwise be reduced due to charge exchange between ions and molecules of gas which may be present. If the charge is removed from an accelerated ion, no further mass analysis can be performed to guide it and maintain it within the beam, thus reducing beam current. To avoid contamination, an atmosphere of a noble gas such as neon and silane ($SiH_4$) is typically used. A high vacuum is also used to reduce reduction of beam current by charge exchange.

Since ions carry the same positive charge, they will mutually repel each other unless oppositely charged particles are available to neutralize the space charge of the beam. At particle energies of above 10 Kev, even at high vacuum, the beam energy imparted to the extremely low pressure atmosphere within an ion beam device will produce a plasma which will provide substantially full space charge neutralization at high vacuum. However, when the ion beam energy is reduced to 5 KeV or less, it has been found by the inventors that a lower vacuum atmosphere of about $1 \times 10^{-4}$ Torr is required to neutralize the space charge of the beam. Even this low pressure severely reduces beam current due to charge exchange. Alternatively, if the space charge is less fully neutralized, beam current is lost during mass analysis due to the interfering effect of the mutual repulsion between ions, particularly if the beam is focussed or concentrated or current density otherwise increased, as the inventors herein have found to be desirable to enhance mass analysis.

It is also important to note that electrostatic deceleration lens arrangements, even when operated at fairly low voltages to reduce the particle energies from about 1-10 KeV to about 0.5 KeV, causes the beam to diverge. The divergence of the beam will also be increased since the space charge neutralizing particles must be removed from the ion beam prior to deceleration. Therefore, the mutual repulsion between ions will be great since the particle beam must be focussed at virtually the same point along the beam path that deceleration is desired. It is therefore particularly desirable to keep the beam energy low in order to reduce the operating voltage necessary for the electrostatic deceleration lens for minimization of beam divergence, especially at high current densities. However, this severely conflicts with the performance of mass analysis at high current densities and low energies as pointed out above.

It should also be noted that the deceleration lens is electrostatic and typically takes the form of an aperture of some type. Additionally, as disclosed in the above-incorporated patents, the beam is substantially collimated by a mass separator plate. While the mass separator plate provides the function of increasing the purity of the deposited material, it makes the focussing of the beams of ions of different elements especially critical if it is not to severely reduce beam current or alter the relative amounts of each type of ion deposited, particularly where broad multi-aperture ion sources are used to obtain high currents. This is also true of the deceleration lens and the beam must be accurately collimated to avoid introducing distribution differentials across the beam pattern at the target.

SUMMARY OF THE INVENTION

It is therefore an object of the present invention to provide a method and apparatus for achieving epitaxial growth of a crystalline material with a mass analyzed ion beam at increased ion beam currents and current densities.

It is another object of the invention to provide an apparatus and method for simultaneously depositing a plurality of materials at high current, high vacuum and at sufficiently low energy for homogeneous epitaxial crystal formation to occur.

It is another object of the invention to provide an apparatus and method for producing a wide, focussed, mass analyzed, plural element ion beam with high resolution, high current density and homogeneity.

To achieve the foregoing and other objects of the invention, an ion beam deposition apparatus for producing low temperature epitaxial growth of a semiconductor material including at least a first ion source is provided including a magnet for mass-analyzing an ion beam from at least said first ion source including and focussing said ion beam int o a pattern of high aspect ratio.

In accordance with another aspect of the invention, a method of depositing a material on a surface by ion deposition of a material from an ion beam from at least one ion source having a two-dimensional array of extraction apertures including the step of simultaneously mass analyzing and focussing said beam in at least one plane with a single magnet means having an arcuate ion optical axis.

In accordance with a further aspect of the invention, an apparatus for producing an ion beam within a volume of ionizable gas at high vacuum is provided including means for increasing the concentration of electrons available for space charge neutralizing said ion beam from said ionizable gas.

BRIEF DESCRIPTION OF THE DRAWINGS

The foregoing and other objects, aspects and advantages will be better understood from the following detailed description of a preferred embodiment of the invention with reference to the drawing, in which:

FIGS. 6b and 6c are cross-sectional views of the focussing coil along section lines C—C and B—B of FIG. 4, illustrating multi-pole magnetic plasma confinement, FIG. 6d is a cross-sectional view of the focussing coil similar to that of FIG. 5, illustrating electrostatic plasma confinement.

DETAILED DESCRIPTION OF A PREFERRED EMBODIMENT OF THE INVENTION

Figure 1:
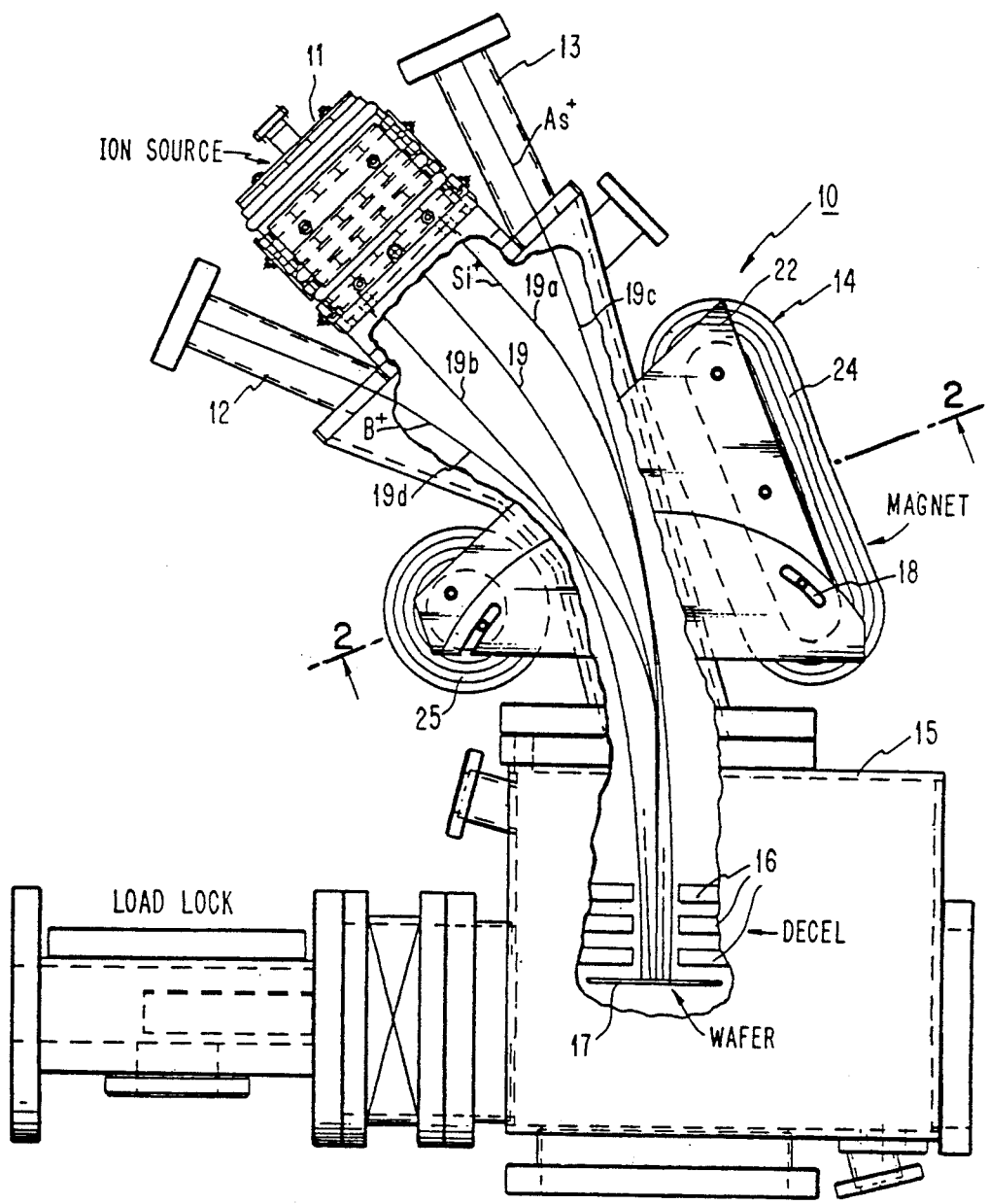
FIG. 1 is an overall view of the ion beam epitaxial growth apparatus according to the invention.

Referring now to the drawings, and more particularly to FIG. 1, there is shown an overall view of the ion beam epitaxial growth apparatus 10 in accordance with the invention. The principal elements of the apparatus are the high current silicon ion source 11, boron impurity ion source 12, arsenic impurity source 13, focussing magnet 14, vacuum chamber 15, deceleration lens 16 and target wafer 17. It should be recognized that if other impurity elements are to be deposited, the positions of impurity sources 12, 13 must be changed to compensate for differences in the ion mass and to ensure that the ions enter the focussing magnet at approximately the correct position to be superimposed on the silicon ion beam. The focal length of focussing magnet 14 can also be adjusted by altering the angular position of the focussing magnet provided by arcuate slots 18 for achieving superposition of beams from the different sources.

It should also be appreciated that the silicon component of the ion beam current is typically far greater than the impurity ion component. Therefore, the silicon ion source 11 is illustrated as a multi-aperture source and the impurity ion sources 12, 13 are illustrated as single aperture sources. It is to be understood that multi-aperture sources could also be used for developing the impurity component of the ion beam current, if necessary. For instance, in arrangements for depositing GaAs or GaAlAs, two, three or more multi-aperture sources would preferably be used. It is also to be understood that in the so-called single aperture ion source, the ions are drawn from a plasma in the source through a grid-like structure which may, in fact, be formed as a plurality of apertures, as in the preferred embodiment of the invention where a linear array of such apertures is provided by a screen-like grid.

While the basic configuration and elements of the present invention may appear superficially similar in structure and operation to the arrangements disclosed in the above-incorporated patents, the mass-analysis magnet also functions, most importantly, as a focussing magnet and the ion sources are modified to provide both electrostatic focussing and steering in accordance with various aspects of the present invention to function in combination in a manner which results in greatly improved performance. Further apparatus for enhancing beam current delivered to the target, specifically plasma containment and enhancement structure, not shown in FIG. 1, is also provided in combination with these modifications in accordance with other aspects of the invention. These aspects of the invention will now be discussed in turn.

Focussing Magnet 14

It is important to understand that focussing magnet 14 performs both the mass analysis and focussing function. For this reason, the focussing magnet is formed in an arcuate shape with a relatively wide gap as shown at 21 of FIG. 2. The design of this magnet provides a substantially uniform magnetic field across the entire width of gap 21. The arcuate shape provides a substantially linear variation in path length through the magnet with position of entry into the focussing magnet gap.

Considering ions of a given mass from any one of ion sources 11-13, the magnet provides focussing by virtue of the position at which the beam component enters the focussing magnet. For example, as is well understood in the art, an ion entering the focussing magnet along axis 19 is caused to follow an arcuate path, as shown. Since the focussing magnet has an arcuate form and maintains a substantially uniform field across the wide gap, an ion entering along path 19a would follow a longer path through the magnet and, hence, would be deflected to a greater degree than an ion following path 19. Conversely, an ion following path 19b would be deflected less, due to its shorter path through the magnet. Thus, it is seen that ions entering the arcuate focussing magnet from different positions, as from a relatively wide multi-aperture source 11 (e.g. having a two dimensional array of extraction apertures, such as a plurality of parallel slit apertures), will be brought to a common focus in the radial plane, resulting in a beam having a potentially high aspect ratio.

Ions of different mass, such as boron, which is lighter than silicon, and arsenic, which is heavier than silicon, will be similarly affected by the arcuate focussing magnet but deflected by respectively greater of lesser amounts due to their difference in mass as shown by paths 19c and 19d. Therefore it is seen that the arcuate focussing magnet has mass-analyzing properties which can be used to converge beams of ions of differing masses while at the same time deflecting other ions away from the mass analysis aperture. As will be discussed below, both the angle and position of entry of an ion into the focussing magnet will affect the position to which it is deflected by the focussing magnet.

It is important to understand that if a wide multi-aperture source like source 11 is used for for ions of a different mass, instead of a slit source, such as 12, 13, the focussing of the wide source into a high aspect ratio beam will also occur as discussed above in regard to source 11 even though the overall deflection of the ion beam will be increased or reduced in dependence on the ion mass.

It should also be noted that the high aspect ratio of the beam allows a narrow slit mass analysis aperture to be used. The narrowness of this slit, in comparison to the aperture of the arrangements disclosed in the above-incorporated patents allows mass analysis to precisely separate ions of a mass differing from that of the ions desired to be deposited.

Further, from the above description of the focussing magnet, it is evident that adjustment of the angular position of the focussing magnet with respect to the beam axis 19 alters the relative differential path lengths of paths 19a and 19b. This alteration of differential path length occurs both because of the angle of the paths through the magnet and the physical alteration of the pole piece length due to the location of arcuate portion 20 of pole piece 22 in relation to the remainder of the pole piece. A similar adjustment arrangement is provided for pole piece 23. Therefore, provision for angular adjustment of the focussing magnet will allow precise adjustment of the focal length of the focussing magnet. This also allows the use of a slit type deceleration lens located precisely at the focal point or crossover of the plural beams.

In order for a uniform magnetic field to be produced over the width of the gap as well as along its depth and length, an important feature of the focussing magnet 14 is the provision of energization coils 24, 25 on both sides of the beam path. Since the effect of the magnet on the ion beam or beams is a function of the varying path lengths provided, it is important that the field be substantially uniform over its length. It should be noted that coil 25 is of circular configuration and located at approximately the center of curvature of the beam axis 19 and coil 24 is formed in an elongated oval or arcuate oval shape to provide uniformity of the magnetic field over the length of the focussing magnet. While an arcuate oval shape may be theoretically preferable in this regard, such a shape is not easily formed and the configuration illustrated has been found to be entirely adequate to the practice of the invention. At the same time, the cross-sectional area of the gap of the focussing magnet must accommodate the width and depth of the multi-aperture ion source or sources used and must have a substantially uniform magnetic field across its width. To achieve this effect, the number of Ampere turns of each of energization coils 24, 25 is kept substantially equal to produce equal magnetic fluxes. Thus variations in magnetic field across the width 21 of the focussing magnet gap due to the flux of either coil will be fully compensated by the other coil. For this reason, so-called C-type magnets, such as are shown in U.S. Pat. No. 4,633,138, and picture frame magnets are unsuitable for this application. Picture frame magnets have coils positioned around the pole pieces which are located on opposing sides of a rectangular yoke which completes the magnetic circuit. In both of these configurations the resulting field is characteristically non-uniform at large gaps and the working area where the field is reasonably uniform is limited to a region of the pole pieces which is more than the magnet gap length away from the edges of the pole pieces. Therefore, unless the pole piece width was more than twice the gap dimension, no working area of usable field uniformity would exist. By the same token, the volume of the gap of a picture frame magnet would need to be three times that of the magnet according to the present invention to provide an equivalent working area. It should be recognized that for good focussing properties, the uniformity discussed above can apply to zeroth order as well as first and second order variations of the magnetic field with magnet dimensions.

The sector shaped pole pieces 22, 23 of the focussing magnet designed according to a preferred embodiment of the invention, as illustrated, thus achieves a substantially constant magnetic field over a large gap width and sufficient depth 27 to avoid restriction of cross-sectional area 26 and over a gap length along axis 19 which is roughly twice the width of a pole face. This length is also roughly one half of the radius of the axis 19 of the arcuate magnet.

In summary, the simultaneous use of a magnet for mass analysis and focussing the ion beam in the radial plane allows improved mass analysis and the accurate focussing of ion beams from wide sources and different masses into a beam of potentially high aspect ratio. This aspect ratio allows epitaxial growth to be performed on limited areas of the wafer or the entire wafer by scanning the wafer or chip across the beam at an angle to the beam footprint. It should also be noted that the improved mass analysis provided by the arrangement of the focussing coil and the mass analysis slit allows electrons and plasma ions from the background gas to be stripped from the beam with greater efficiency prior to passage through a deceleration lens close to the target surface which reduces ion energy to a low final deposition energy.

Ion Beam Sources 11, 12, 13

Ion beam sources 11–13 may be of any known type, as indicated above, although it is anticipated that a multi-aperture source, as illustrated, will be required for at least the silicon ion source. While the invention is described in terms of a silicon source, it should be understood that any other semiconductor material could be used in a similar way, with suitable modification of the geometry and field strengths dictated by ion mass. The specific design of the ion source is not critical to the practice of the invention and the ion source arrangements of the above-incorporated patents are suitable for the practice of the present invention. An alternative suitable design for the ion source is described in detail in Keller et al U.S. Pat. No. 4,383,177 also assigned to the assignee of the present invention and fully incorporated by reference. The only requirements of the ion source design are that the sources be capable of producing the required ion current and that some focussing of the beam be done at the ion source so that the beams will have a predictable geometry at the focussing magnet. For this reason, the provision of source focussing in combination with magnetic focussing is an important aspect of the present invention.

However, as pointed out above, the angle of impingement of ions of different species on the target must preferably be kept substantially perpendicular to the target. Further, because of the use of a narrow slit mass separation plate and/or deceleration lens 16, it is important to be able to provide accurate superposition of the beams from each of the ion sources while maintaining substantially perpendicular impingement of each of the beams from each ion source on the target. While it is known in the prior art to provide post-mass analysis deflection of the ion beam and such post-mass analysis deflection could potentially provide superposition of the beams, the angle of impingement would be varied. Moreover, such post-mass analysis deflection takes up space over which it would be difficult to maintain convergence of the beam at low energies. Therefore, post-mass analysis deflection is deemed to be unsuitable for use in the present invention. Adjustment of the magnetic field of the focussing magnet of the present invention could also be used to achieve convergence during mass analysis but such an alternative would require a complex adjustment, involving the geometry of the entire apparatus as well as operating voltages and currents and, hence, would result in complicated operation of the entire device.

As pointed out above, the actual path of a beam through the focussing magnet will depend on both the angle and position of entry into the focussing magnet. Therefore, given the particular function of the focussing magnet, it has been found desirable to be able to steer at least two of the three beams in order to provide for selective fine variation of beam position.

For this reason, in accordance with an aspect of the invention, a split acceleration plate is provided. While it is necessary in an ion source to provide electrodes or lenses which serve to extract ions from the plasma in the source and accelerate the ions to the desired energy, in accordance with the present invention, at least one electrode functioning as an acceleration plate or lens is divided into two portions adjacent to opposite sides of the beam, as shown in FIG. 3.

Figure 3:
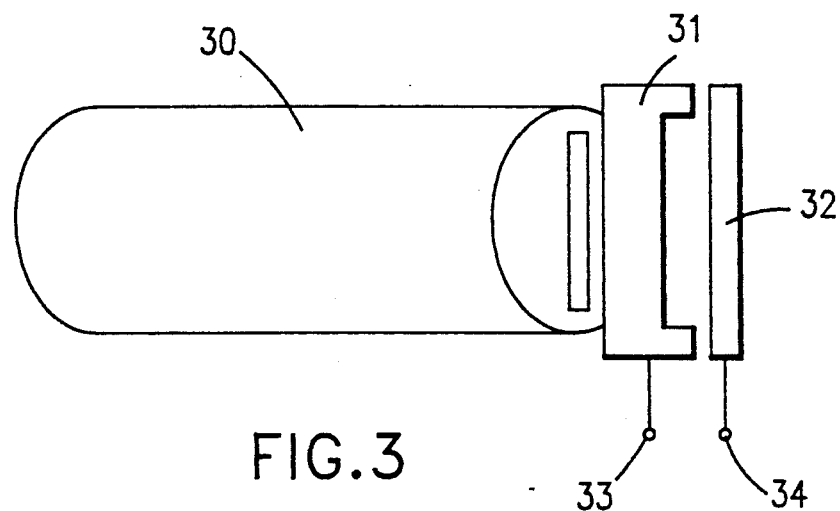
FIG. 3 is a simplified schematic view of an ion source showing the use of a divided acceleration plate for beam steering according to the invention.

FIG. 3 shows an ion source 30, corresponding to either source 12 or 13 of FIG. 1. The split acceleration plate s shown having left and right halves 31, 32. The average of the voltages applied to these plates 31, 32 will control the energy of the ions in the beam as in the acceleration structures of the prior art. However, if slightly different voltages are applied to terminals 33, 34, connected to plates 31, 32, these plates will also act as electrostatic deflectors and provide steering of the beam in a plane perpendicular to the long dimension of the beam.

Figure 4:
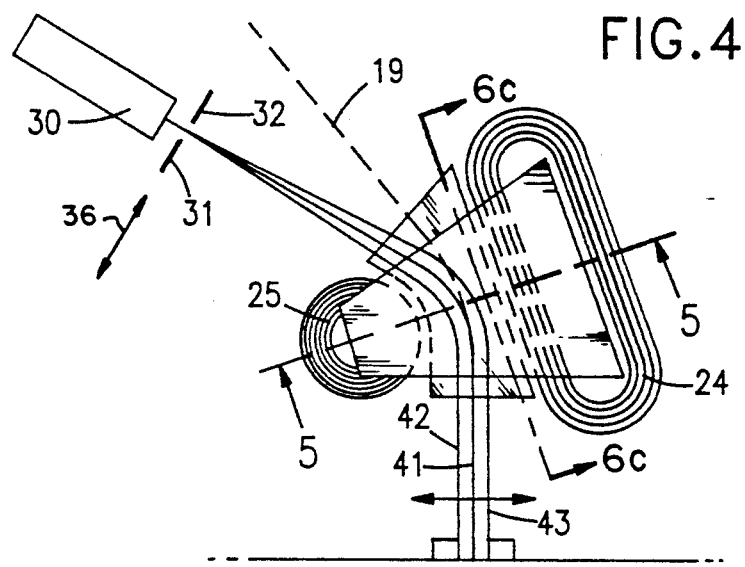
FIG. 4 shows the apparatus of FIG. 1 with some elements removed for clarity in illustration of the operation of the divided acceleration plate of FIG. 3.

Referring now to FIG. 4, it is seen that lateral deflection of the beam alters both the angle and position where the beam enters the focussing magnet. It can also be readily seen that if the beam is deflected to the left, in this view, it will follow a longer path through the magnet than if it is deflected to the right. Therefore, as described above, the left-deflected beam would be deflected to a greater degree in the focussing magnet than a right-deflected beam and the difference in angle between these deflections can be exactly compensated by placing the ion source at the front focal plane of the focussing magnet. The net result is merely a shifting of the point of impingement on the target without altering the angle of impingement. Thus the impurity ion beam can be steered to precisely coincide with the silicon ion beam represented by the ion optical axis of the focussing magnet shown in this Figure by dashed line 19.

While steering can be made to alter the location of the beam impingement with exact compensation of angle of impingement, in practice, this has been found to be relatively non-critical. The angular change in ion trajectory caused by steering is relatively small and will be compensated to some degree by the focussing magnet. Therefore, even without adjustment for exact compensation, the variation in impingement angle will typically be less than the angular variation in impingement angle caused by the deceleration lens and also typically within the range of dispersion angles which can be accomodated thereby.

It should be noted that this pre-mass analysis deflection aspect of the invention does not require any additional post-mass analysis structure while preserving the geometry of the entire optical system. This is due to the extractor/acceleration lens being a diverging cylindrical lens having a negative focal length of approximately 3 times the acceleration gap (e.g. the distance between the plasma in the ion source and the split acceleration plate). It should also be noted that steering of the beam can also be accomplished by moving the acceleration lens, either with or without additional electrostatic compensation, as indicated by arrows 36 in FIG. 4. Because of the compensation provided by the focussing magnet, adjustment of the differential steering voltage is independent of other operating parameters of the system and requires only adjustment for maximum impurity ion current at the target or output of the mass analysis aperture.

Plasma Containment

Figure 2:
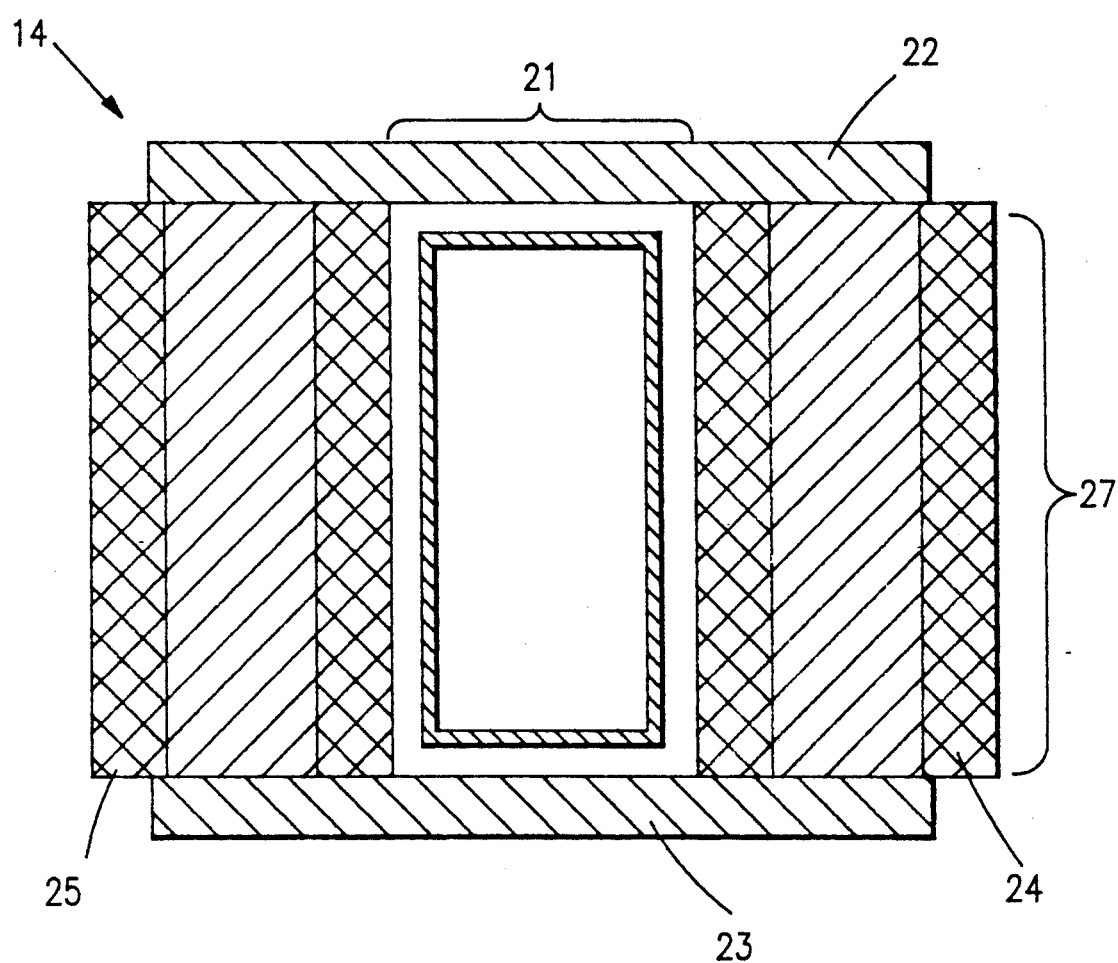
FIG. 2 is a cross-sectional view of the focussing magnet along its axis, taken at Section A—A of FIG. 1.
Figure 5:
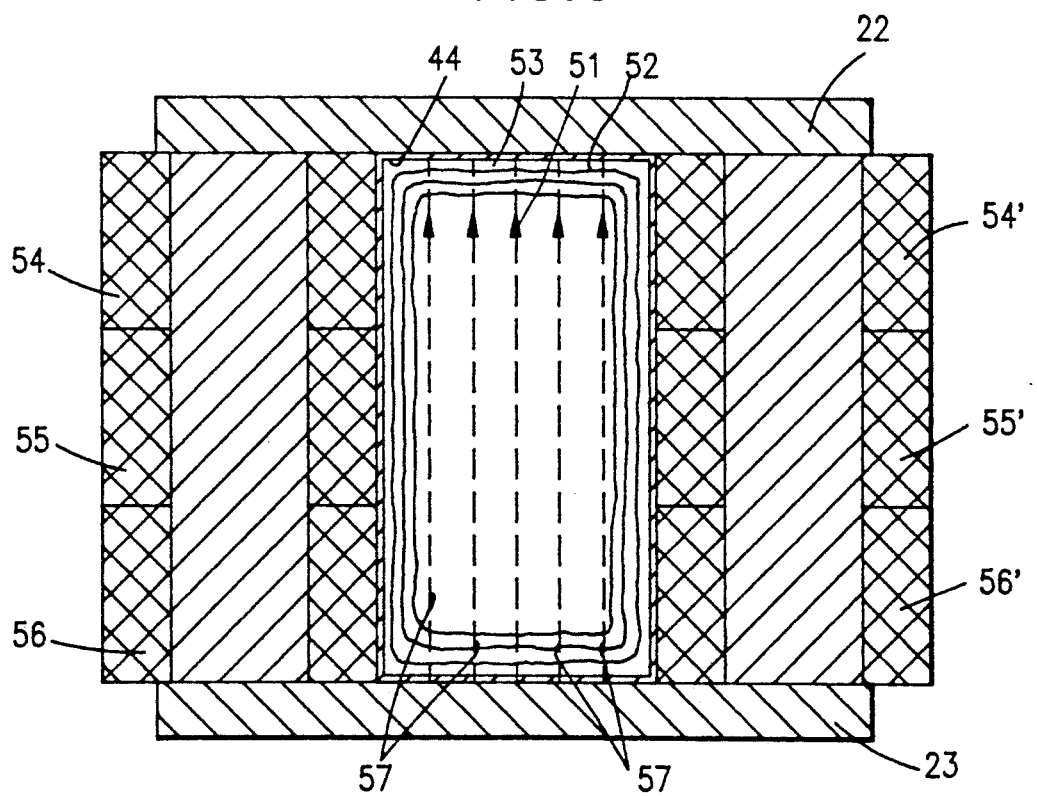
FIG. 5 is a cross-sectional view of the focussing coil of FIGS. 1 or 4, taken along section C—C of FIG. 4 in accordance with the invention.

Referring now to FIG. 5, a cross-section of a focussing magnet generally corresponding to FIG. 2 is shown. The particular embodiment shown includes three pairs of coils 54, 54', 55, 55', 56, 56' which will be discussed more fully below. Pole pieces 22, 3 correspond to FIG. 2. If equal currents, typically on the order of 120 A, are passed through each of the pairs of coils, a magnetic field of high uniformity results, as discussed above, as indicated by dashed lines 57.

As discussed above, the development of a plasma along the ion beam inherently occurs, even at high vacuum of a noble gas/silane mixture at beam energies above about 5 KeV. This plasma contains ions and electrons which will assume a steady state distribution within and around the ion beam 51 to fully space charge neutralize the beam. As further discussed above, at lower beam energies, the lack of full neutralization of the space charge causes beam current to be reduced due to the mutual repulsion of the ions interfering with the mass analysis function of the focussing magnet. If the atmosphere is increased to increase plasma density, to neutralize the space charge at low ion energies, beam current is lost through charge exchange with the molecules of the atmosphere within the vacuum chamber.

While a number of plasma confinement techniques are known in high energy devices, such as gas lasers and fusion reactors, they have not been heretofore applied to relatively low energy devices to preserve an inherent plasma density. Therefore, a further aspect of the invention is the containment of the plasma produced within the magnet of the ion beam device. By doing so, the plasma density even at low ion energies can be maintained at a higher equilibrium level, allowing reduction of ion energy, vacuum atmosphere density or both. This, in turn, permits maintenance of high beam current during mass analysis under vacuum and ion energy conditions where such high beam current could not previously be maintained.

In the high vacuum atmosphere within the magnet, the beam will form a distribution of positively charged ions toward the center of the magnet gap. The plasma which is formed will initially have equal numbers of electrons and positively charged ions which will rapidly distribute themselves until an equilibrium condition is reached. Electrons predominate within and around the beam 51 and the mutual repulsion of positive plasma ions surrounding the beam balancing the mutual repulsion of the ions in the beam (moderated, of course, by the attractive forces toward electrons in the beam) as shown at 52. Electrons are also trapped on the magnetic field lines within the magnet gap near the surfaces of the pole pieces in the region generally indicated at 53.

Raceways are typically used in ion beam devices. Prior raceways through a magnet gap have attempted to maintain all surfaces at a common potential, normally ground potential, to avoid disturbing the beam path. Therefore, many plasma electrons were lost through contact with the raceway walls, causing a reduction in the density of plasma available for space charge neutralization of the beam. The present invention also utilizes a raceway generally configured as shown at 44 of FIGS. 4 and 5 but confines these electrons either electrostatically or magnetically, as will be described in more detail below, to prevent depletion of the plasma density. Therefore, since electrons are not removed from the plasma through contact with raceway 44, ionization of the background gas can be an effective beam-induced plasma source at lower ion energies or higher vacuum levels or both than was possible in the prior art. Magnetic confinement suitable for use in the preferred embodiment of the invention can take the form of so-called magnetic mirror confinement illustrated at FIG. 6a. This type of plasma confinement causes an increasing magnetic field gradient in the vicinity of the magnetic poles as indicated by magnetic field lines 61. The contours of constant magnetic potential are perpendicular to the field lines and are shown by chain lines 62 at the pole pieces of the focussing magnet. The configuration of the magnetic field can be produced by, for instance, passing a larger current of, say 180 A, through coils 54, 54', 56, 56' and a smaller current, say of 0–60 A, through coils 55, 55'. Clearly the magnetic field can be shaped at will by varying currents in coils 55, 55' to optimize magnetic mirror containment while maintaining proper beam focussing by simply maximizing ion beam current at the mass analysis aperture 16. In an alternative form of the invention, magnetic mirror confinement can also be achieved by shaping of the magnetic pole pieces. As electrons approach the pole pieces, the increasing magnetic field deflects them until the pole pieces are not reached by the electrons.

A suitable alternative magnetic confinement which has been used in ion sources, as disclosed in U.S. Pat. No. 4,383,177, incorporated by reference above, is also of suitably simple construction and referred to as multipole confinement. In this type of plasma electron confinement, illustrated in FIGS. 6b and 6c, small permanent magnets 64 can be placed on the inside or outside of the pole pieces or permanent magnetic domains can be formed within the bulk of the pole piece itself. In multipole confinement, the magnets or magnetic domains are arranged so that the magnetic field will be slightly increased over a predominant portion of the pole piece surface while a lesser number of domains or magnets (hereafter referred to collectively as "domains") are oppositely oriented. As shown in FIG. 6c, showing a cross-section of the focussing magnet along section line B—B, perpendicular to section line C—C of FIG. 4, the distribution of magnets or domains is two-dimensional and preferably regular over the faces of the pole pieces. Numerous patterns are possible, such as a domain of one polarity, corresponding to domain 68, surrounded by six domains of opposite polarity, corresponding to domain 69 in a hexagonal array such that the pattern of domains 69 assumes a honeycomb formation. It is also desirable that the domain on one pole piece be aligned with the corresponding domains of the other pole piece but such alignment is not critical to the practice of the invention since the effects are predominantly local and outside the ion beam. As with magnetic mirror confinement, this patterned alteration of the magnetic field can also be achieved by shaping of the pole pieces by the formation of depressions therein corresponding to the locations of domains but this possibility is not as effective and requires greater pole piece size to accommodate the depressions while maintaining low reluctance of the bulk of the pole pieces.

Figure 6A:
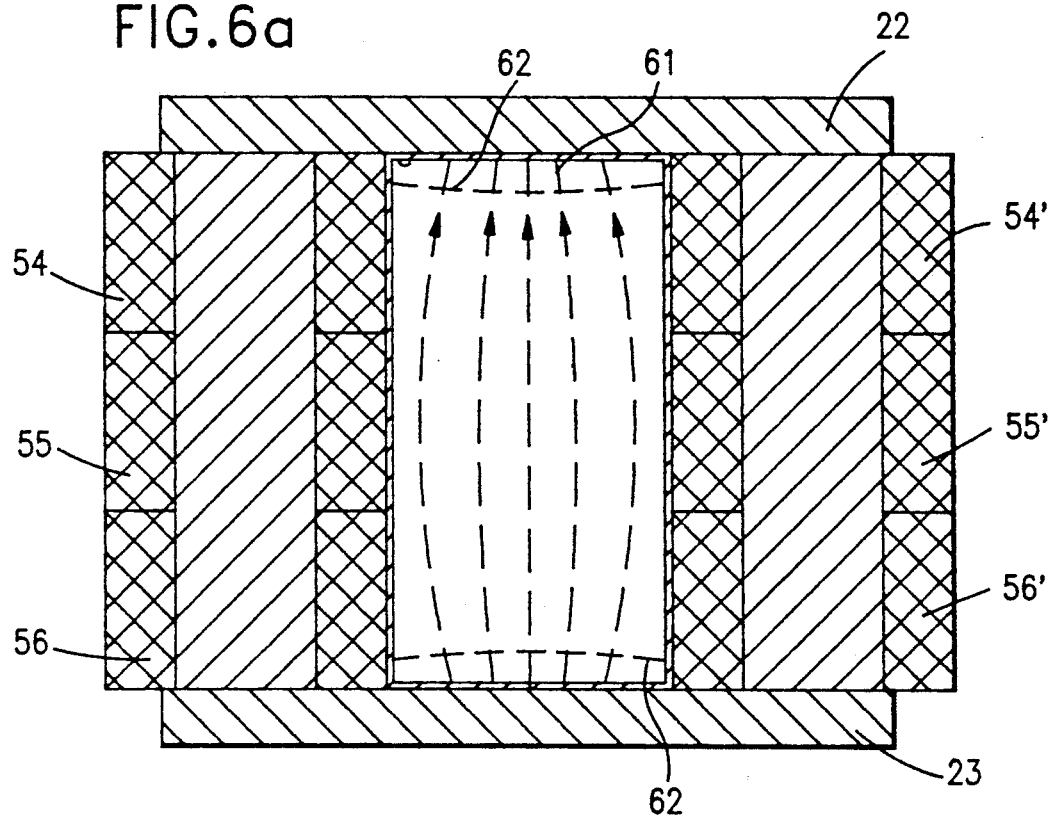
FIG. 6a is a cross-sectional view of the focussing coil similar to that of FIG. 5, illustrating magnetic mirror plasma confinement.
Figure 6B:
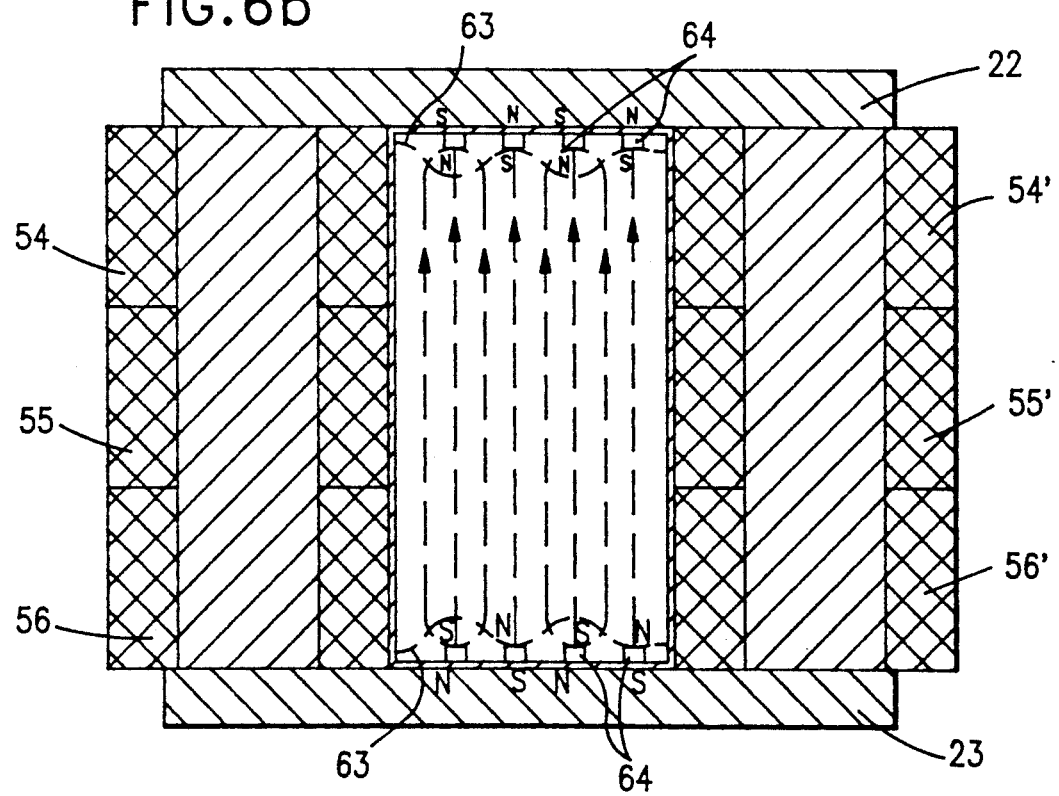

Such a patterned arrangement of means for locally varying the magnetic field strength over the faces of the pole pieces will achieve an increase in magnetic field over a large fraction of the pole piece surface causing a magnetic mirror effect in those areas, as shown by chain line 63 in FIG. 6b. Some electrons will, of course, be lost in areas where the magnetic field is reduced but only in approximate proportion to the fraction of the total pole piece surface represented by those areas.

For electrostatic confinement in this particular application, as illustrated in FIG. 6d conductive electrodes 66 are provided on or over the pole faces, preferably by means of insulators 65, within the section of the raceway 44 and a negative voltage in the range of −5 V to −200 V from DC source 67 is applied to repel the trapped electrons a small distance from the electrodes and raceway. This effectively prevents the electrons from forming a current to ground through the pole pieces or through the raceway 44. An insulator could also be used if it is protected from the ion beam in some way, such as by a beam shaping aperture upstream from the focussing magnet.

Regardless of the manner in which it is accomplished, the effect of plasma electron confinement is pronounced. Experiments with magnetic mirror confinement, in accordance with the invention as illustrated in FIG. 6a, have resulted in increases in beam current of at least 20%. Therefore, a substantial operating margin can be provided by plasma confinement within the focussing magnet where either less than full (e.g. less than approximately 99%) space charge neutralization and/or charge transfer had reduced ion beam current in the past.

RF and Microwave Driven Beam Plasma

In addition to increasing the plasma density by plasma confinement, as discussed above, it is also possible, in accordance with the invention to produce a plasma within the magnet other than by the energy in the ion beam itself, as discussed above. This is done, in accordance with the invention by introducing a high frequency electric or magnetic field into the cavity of the magnet, itself (e.g. within the raceway 44, if used). Coupling energy to the background gas and the electrons generated by the ion beam at beam ion energies below 5 KeV increases the plasma density and particularly the electron density within the magnet so that more electrons are available to neutralize the space charge of the ion beam. Since the availability of a greater density of electrons is available to neutralize the space charge of the beam, the beam can be kept intact at reduced pressures (e.g. higher vacuum levels) and beam ion energies, thus further reducing the amount of ion beam current lost through charge exchange and reducing demands of the design and operation of the deceleration lens. It should be noted that while RF and microwave driven beam plasma can be utilized in accordance with the invention entirely independently of whether or not plasma confinement techniques such as those described above are used, it is preferred to used these techniques together for greatest efficiency with regard to deposition apparatus power requirements, high beam current, minimum beam ion energy during mass analysis, minimum deceleration requirements, minimum loss of beam convergence during deceleration and minimum ion deposition energy.

Figure 7A:
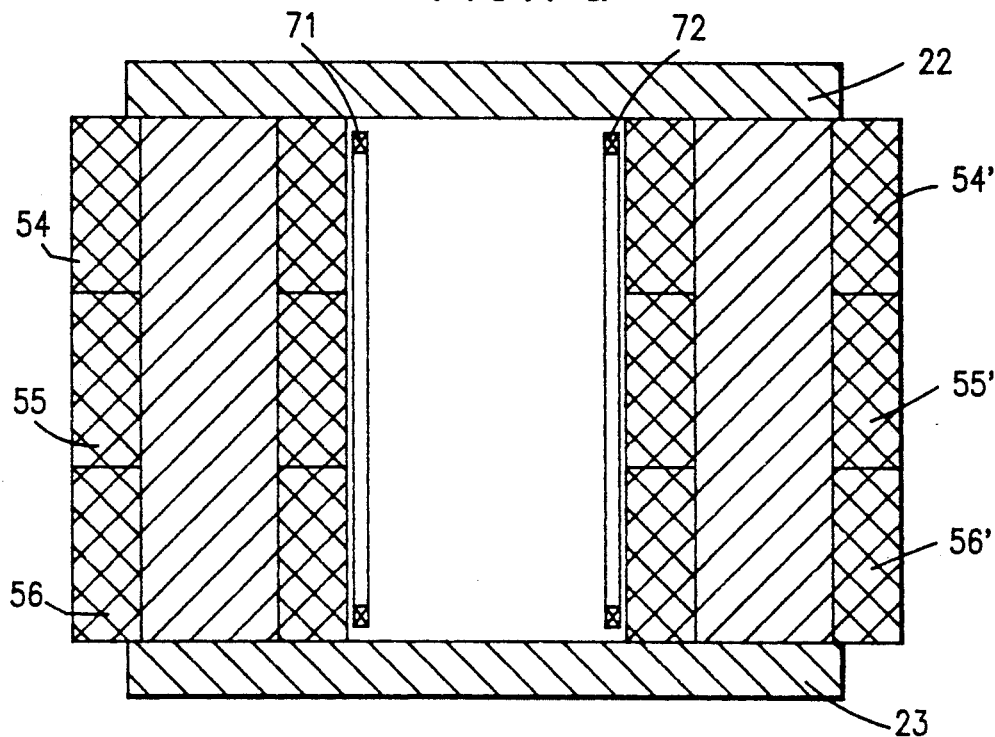
FIG. 7a is a cross-sectional view of the focussing coil similar to that of FIG. 5, illustrating helicon RF plasma generation.

Referring now to FIG. 7a, a cross-section of the focussing magnet at section C—C is again shown, as in FIGS. 5, 6a, 6b and 6d. The raceway 44, if used, is omitted from this drawing for clarity of illustration. According to one embodiment of this aspect of the invention, coils 71, 72, which are preferably thin, as shown, and of generally rectangular shape to conform to the interior of the focussing magnet or raceway, are provided. These coils are preferably poled as shown and driven by a frequency preferably in the range of from about 15 MHz to about 40 MHz at a power of about 100–300 watts. These coils essentially constitute a radio frequency (RF) antenna and develop an RF magnetic field perpendicular to both the ion beam current and the field of the focussing magnet. The essential requirement is that the field produced by the RF antenna be substantially perpendicular to the DC field of the focussing magnet. This produces a helicon wave which excites the plasma. Other coil configurations are possible and may be advantageous. For instance, a so-called serpentine coil configuration could be used, surrounding the ion beam and potentially avoiding restriction of the raceway cross-section. Particularly because of the high frequency relative to the ion velocity or transit time through the focussing magnet, the ion beam path is not substantially effected by the coupling of RF energy to the background gas within the focussing magnet and a plasma can be generated to supplement the small density of plasma which may be generated by the ion beam at low ion energies.

Figure 7B:
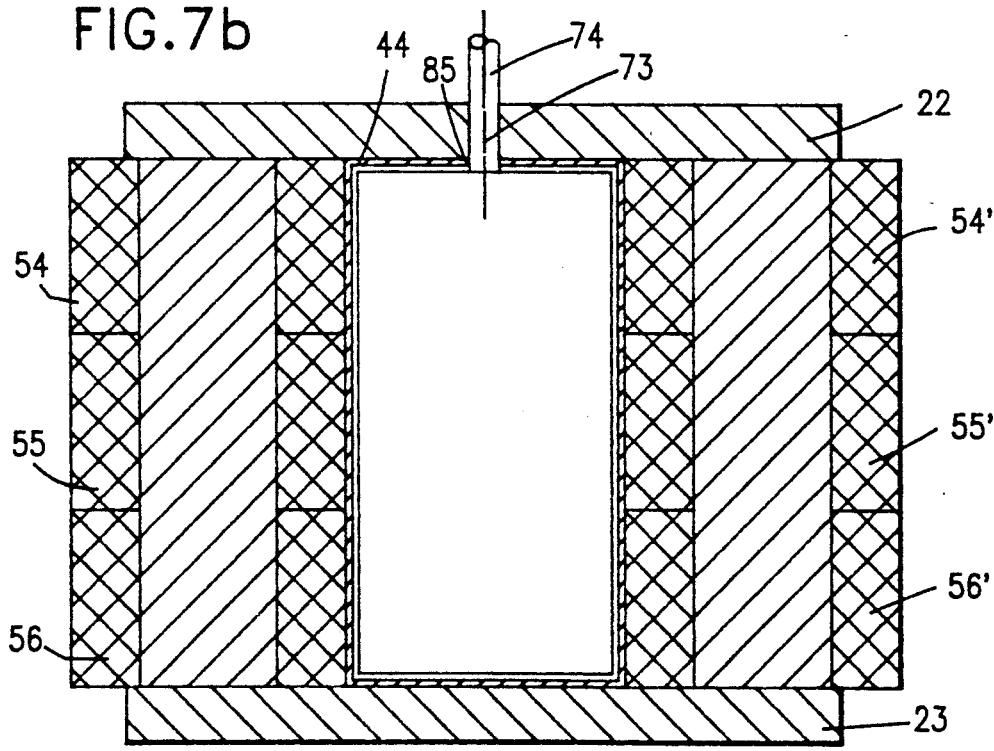
FIGS. 7b and 7c are cross-sectional views of the focussing coil along section lines C—C and B—B of FIG. 4, illustrating microwave plasma generation.
Figure 7D:
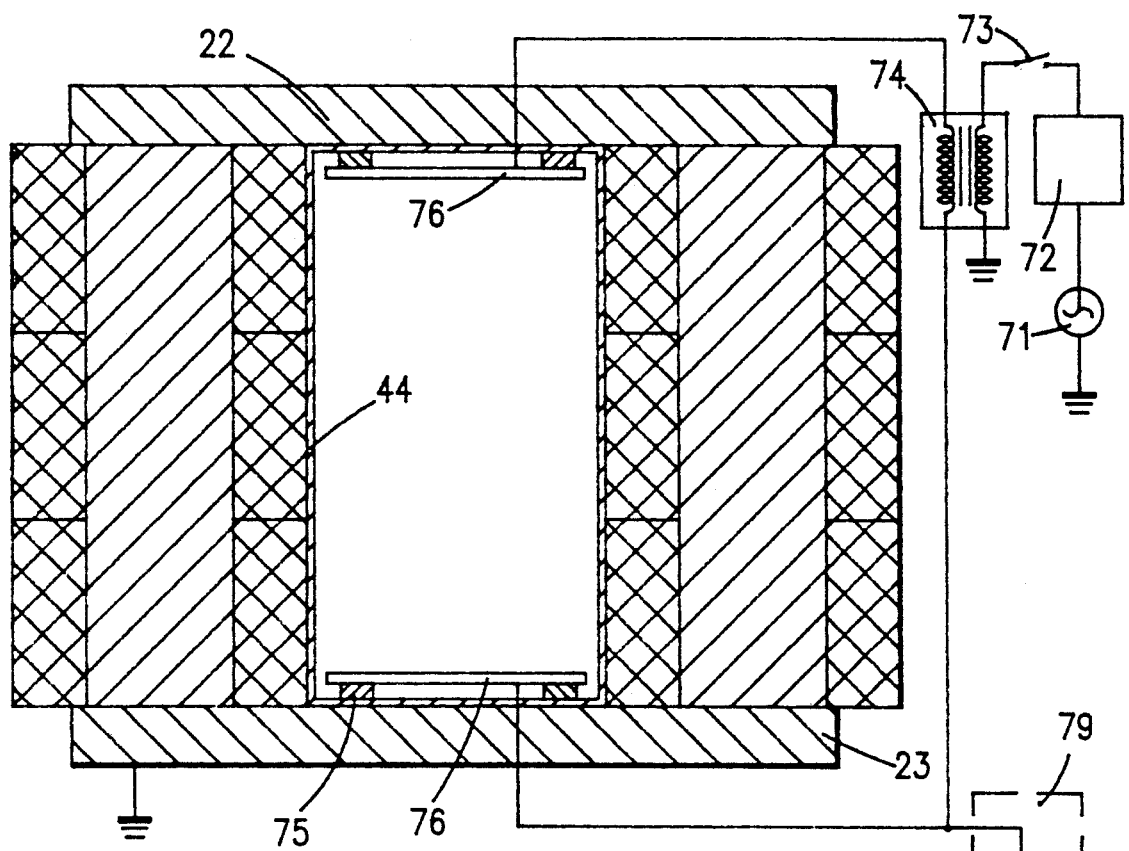
FIG. 7d is a cross-sectional view of the focussing coil similar to that of FIG. 5, illustrating capacitively coupled RF plasma generation.
Figure 7C:
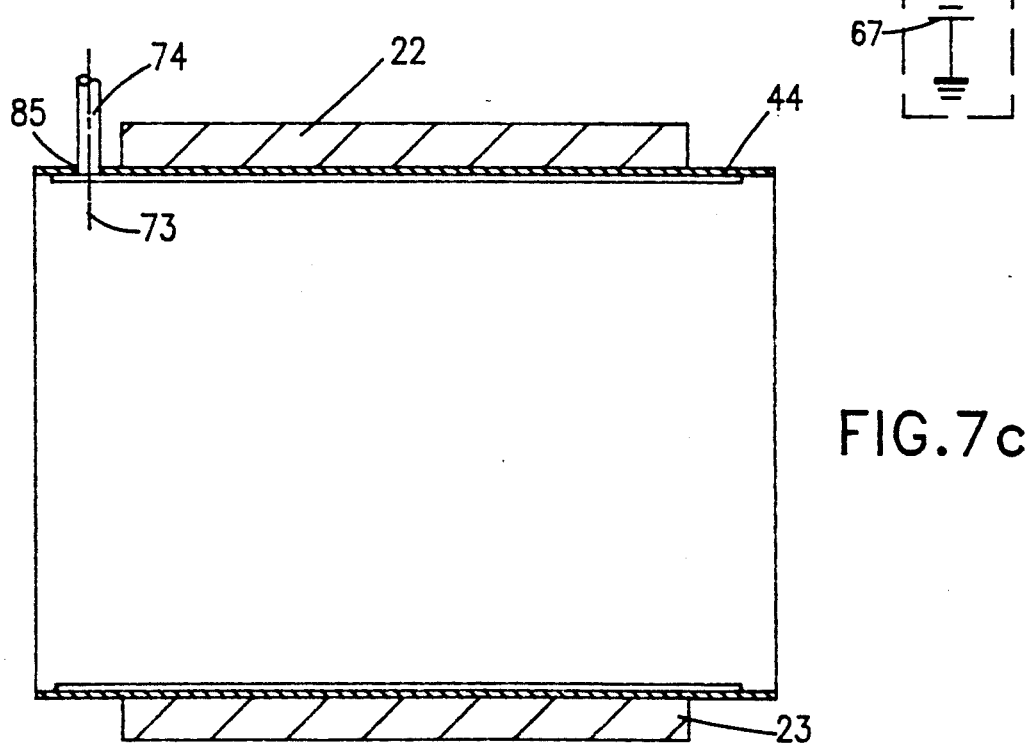

As an alternative to RF magnetic drive of plasma within the focussing magnet, microwave drive can also be used as shown in FIG. 7b and 7c. In FIG. 7b, raceway 44 is shown since it provides a convenient construction for this embodiment but, as in other embodiments is not necessarily required. For microwave drive of the plasma, microwave power, preferably of about 100–250 watts at 2.4 GHz or a frequency which is near the cyclotron resonant frequency for the magnetic field in the magnet, is provided to the focussing magnet gap through a waveguide preferably formed of a coaxial cable 74 which forms antenna 73. The coaxial cable is brought into the cavity through a hole and vacuum seal, preferably in the raceway near the pole pieces where the ion beams from the ion sources enter the focussing magnet as shown in FIG. 7c. The location is non-critical and does not justify perforation of the magnet pole pieces to form a window for the waveguide and vacuum seal 75 although this could also be done.

It should be noted that an advantage of this particular form of plasma drive is the fact that the means for coupling energy to the background gas within the magnet requires a minimum amount, if any, of the cross-sectional area of the magnet. In this regard, other forms of waveguide could be used which would not intrude at all into the magnet cavity.

Referring now to FIG. 7d, showing a cross-sectional view along section line C—C of FIG. 4, an alternative form of plasma drive utilizing capacitive coupling of RF energy to the plasma is shown. Within grounded raceway 44, insulators 75 are provided to support conductive plates 76 over the pole pieces 22, 23. Conductive plates 76 are driven from an RF source 71 through a coupling network 72 and transformer 74 when switch 73 is closed to couple RF energy to the background gas and electrons within the focussing magnet to produce a plasma therefrom in a manner similar to the magnetic and microwave embodiments discussed above.

It should be noted that the structure inside the focussing magnet and/or raceway is identical to that used in FIG. 6d for electrostatic confinement of the beam induced plasma. Therefore, if electrostatic confinement should be chosen, this capacitive coupled RF drive arrangement can also be employed without further constriction of the focussing magnet cavity through which the ion beam must pass. In this case, the magnetic confinement potential can be provided by DC power supply 79, similar to 67 of FIG. 6d with the further inclusion of choke 78 to prevent the RF signal from disrupting DC source 67.

From all of the foregoing, an apparatus for producing epitaxial monocrystalline semiconductor growth at low temperatures has been provided by a mass-analyzed ion beam device which particularly features high beam homogeneity and current as well as uniform impingement angle on the target from all ion sources while allowing simple and accurate convergence of ions of differing mass. High beam current is maintained consistent with high purity mass analysis through focussing the beam in the radial plane of the mass analysis magnet by a novel focussing/mass analysis magnet design and plasma containment and/or generation within the magnet to neutralize the space charge of the ion beam and avoid loss of convergence or beam current due to charge transfer with the background gas, the pressure of which, in turn, can be reduced, consistent with other system requirements to increase deposition purity and deposited beam current at lower ion energies.

It should be understood that the various features of the invention can be used singly or in any combination to achieve improved performance over ion deposition systems known in the art but are preferably used together to achieve highest efficiency of ion deposition as well as of the operation of the deposition apparatus, itself.

While the invention has been described in terms of a single preferred embodiment with variant embodiments of particular features thereof, those skilled in the art will recognize that the invention can be practiced with modification within the spirit and scope of the appended claims.

Having thus described my invention, what I claim as new and desire to secure by Letters Patent is as follows:

1. An ion beam deposition apparatus for producing low temperature epitaxial growth of a semiconductor material including at least a first ion source, said ion source providing a particular pattern, said ion beam deposition apparatus including a magnet means having means for mass-analyzing an ion beam from at least said first ion source including means for focussing said particular pattern in at least one plane into a pattern of high aspect ratio at a focal or crossover point located prior to a target.

2. An apparatus as recited in claim 1, wherein said magnet means includes an arcuate ion optical axis, two pole pieces joining poles of a first magnet positioned near a center of said arcuate ion optical axis and corresponding poles of a second magnet positioned opposite said ion beam for said first magnet, thereby defining a cavity within said magnet means.

3. An apparatus as recited in claim 2 wherein said first and second magnets are electromagnets.

4. An apparatus as recited in claim 1, further including at least one second ion source.

5. An apparatus as recited in claim 4, further including means for converging an ion beam from said at least one second ion source with said beam from said first ion source.

6. An apparatus as recited in claim 5, wherein said means for converging an ion beam from said at least one second ion source with said beam from said first ion source includes
means for selectively deflecting said beam from said at least one second ion source to selected locations within said cavity of said magnet means.

7. An apparatus as recited in claim 6, wherein said means for selectively deflecting said beam comprises a split deflector, respective portions of which are electrically isolated from each other and adjacent to opposite sides of said ion beam.

8. An apparatus as recited in claim 1, wherein said ion source is a multi-aperture ion source and
said magnet means includes means for adjusting the focal length thereof to converge beams from said multi-aperture source in said at least one plane.

9. An apparatus as recited in claim 8, further including at least one second ion source.

10. An apparatus as recited in claim 9, further including means for converging an ion beam from said at least one second ion source with said beam from said first ion source.

11. An apparatus as recited in claim 10, wherein said means for converging an ion beam from said at least one second ion source with said beam from said first ion source includes
means for selectively deflecting said beam from said at least one second ion source to selected locations within said cavity of said magnet means.

12. An apparatus as recited in claim 11, wherein said means for selectively deflecting said beam comprises a split deflector, respective portions of which are electrically isolated from each other and adjacent to opposite sides of said ion beam.

13. An apparatus as recited in claim 9, further including means for confining a plasma occurring within said magnet means.

14. An apparatus as recited in claim 13, wherein said means for confirming a plasma comprises electrostatic plasma confinement means.

15. An apparatus as recited in claim 13, wherein said means for confining a plasma comprises magnetic mirror plasma confinement means.

16. An apparatus as recited in claim 13, wherein said means for confining a plasma comprises multipole magnetic plasma confinement means.

17. An apparatus as recited in claim 9, further including means, independent of said ion beam, for producing a plasma from background gas within said magnet means.

18. An apparatus as recited in claim 17, wherein said means for producing a plasma includes RF magnetic field producing means.

19. An apparatus as recited in claim 18, wherein said RF magnetic field producing means includes a pair of coils within said cavity of said magnet means and adjacent said first and second magnets and oriented to produce an RF magnetic field generally perpendicular to a magnetic field produced by said magnet means.

20. An apparatus as recited in claim 17, wherein said means for producing a plasma includes a microwave wave guide means for conveying microwave energy to background gas in said cavity of said magnet means.

21. An apparatus as recited in claim 17, wherein said means for producing a plasma includes a capacitive coupling means for coupling RF energy to background gas in said cavity of said magnet means.

22. An ion beam deposition apparatus for producing low temperature epitaxial growth of a semiconductor material including at least a first ion source including
a magnet means having means for mass-analyzing an ion beam from at least said first ion source including means for focussing said ion beam into a pattern of high aspect ratio, and
means for confining a plasma occurring within said magnet means.

23. An apparatus as recited in claim 22, wherein said means for confining a plasma comprises electrostatic plasma confinement means.

24. An apparatus as recited in claim 22, wherein said means for confining a plasma comprises magnetic mirror plasma confinement means.

25. An apparatus as recited in claim 22, wherein said means for confining a plasma comprises multipole magnetic plasma confinement means.

26. An ion beam deposition apparatus for producing low temperature epitaxial growth of a semiconductor material including at least a first ion source including
a magnet means having means for mass-analyzing an ion beam from at least said first ion source including means for focussing said ion beam into a pattern of high aspect ratio, and
means, independent of said ion beam, for producing a plasma from background gas within said magnet means.

27. An apparatus as recited in claim 26, wherein said means for producing a plasma includes RF magnetic field producing means.

28. An apparatus as recited in claim 27, wherein said RF magnetic field producing means includes a pair of coils within said cavity of said magnet means and adjacent said first and second magnets and oriented to produce an RF magnetic field generally perpendicular to a magnetic field produced by said magnet means.

29. An apparatus as recited in claim 26, wherein said means for producing a plasma includes a microwave wave guide means for conveying microwave energy to background gas in said cavity of said magnet means.

30. An apparatus as recited in claim 26, wherein said means for producing a plasma includes a capacitive coupling means for coupling RF energy to background gas in said cavity of said magnet means.

31. A method of depositing a material on a surface by ion deposition of a material from an ion beam from at least one ion source providing a particular pattern including the step of
simultaneously mass analyzing and focussing said particular pattern in at least one plane at a focal or crossover point located prior to a target plane with a single magnet means having an arcuate ion optical axis.

32. A method as recited in claim 31, including the further step of subjecting at least a portion of said ion beam to a selectable path length different from a path length of another portion of said beam in dependence on the location along a width of said magnet means where said portion of said ion beam enters said magnet means.

33. A method as recited in claim 32, including the further step of producing said another portion of said ion beam from said at least one ion source and producing said portion of said ion beam with a further ion source.

34. A method as recited in claim 33 including the further step of steering said portion of said ion beam to a selected location along said width of said magnet means.

35. A method as recited in claim 31, including the further step of
confining plasma produced within said magnet means to locations separated from poles of said magnetic means.

36. A method as recited in claim 31, including the further step of producing a plasma within said magnet means independently of said ion beam.

37. A method as recited in claim 35, including the further step of producing a plasma within said magnet means independently of said ion beam.

38. An apparatus for producing an ion beam within a volume of ionizable gas at high vacuum, a predetermined fraction of said ionizable gas being ionized by said ion beam including
means for increasing the concentration of electrons available for space charge neutralizing said ion beam from said ionizable gas.

39. An apparatus as recited in claim 38, wherein said means for increasing said concentration of electrons comprises means for confining said electrons within said volume of said ionizable gas.

40. An apparatus as recited in claim 38, wherein said means for increasing said concentration of electrons comprises means for ionizing an additional fraction of said ionizable gas.

* * * * *